(12) United States Patent
Ibuka et al.

(10) Patent No.: US 12,266,514 B2
(45) Date of Patent: Apr. 1, 2025

(54) SUBSTRATE PROCESSING APPARATUS AND SUBSTRATE TEMPERATURE CORRECTION METHOD

(71) Applicant: Tokyo Electron Limited, Tokyo (JP)

(72) Inventors: Rei Ibuka, Miyagi (JP); Dai Igarashi, Miyagi (JP); Yuki Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 444 days.

(21) Appl. No.: 17/652,520

(22) Filed: Feb. 25, 2022

(65) Prior Publication Data

US 2022/0277939 A1 Sep. 1, 2022

(30) Foreign Application Priority Data

Feb. 26, 2021 (JP) .................................. 2021-029629
Jan. 13, 2022 (JP) .................................. 2022-003438

(51) Int. Cl.
*H01J 37/32* (2006.01)
*G05B 19/401* (2006.01)
*H01L 21/67* (2006.01)

(52) U.S. Cl.
CPC ...... *H01J 37/32724* (2013.01); *G05B 19/401* (2013.01); *H01L 21/67248* (2013.01);
(Continued)

(58) Field of Classification Search
CPC ....... G05B 2219/50333; G05D 23/1919; H01J 37/3244; H01J 37/32568; H01J 37/32642;
(Continued)

(56) References Cited

U.S. PATENT DOCUMENTS 8,818,545 B2 * 8/2014 Matsuzaki ........ H01L 21/67109
62/304
2010/0300621 A1 * 12/2010 Brillhart ........... H01L 21/67109
62/62
(Continued)

FOREIGN PATENT DOCUMENTS

JP 2013-105359 A 5/2013
JP 2020-120045 A 8/2020

*Primary Examiner* — Mohammad Ali
*Assistant Examiner* — Dhruvkumar Patel
(74) *Attorney, Agent, or Firm* — XSENSUS LLP

(57) ABSTRACT

A placing table includes a placing surface, a flow path formed inside to allow a temperature control medium to flow therein, and a discharge opening through which a heat transfer gas is discharged. A gas supply is configured to supply the heat transfer gas to be discharged through the discharge opening. A measurement unit is configured to measure a temperature of the temperature control medium. A controller is configured to control, when the temperature of the temperature control medium is changed by equal to or more than a predetermined temperature at a change timing, a pressure of the heat transfer gas to eliminate a temperature change of a substrate caused by a temperature change of the temperature control medium after a predetermined time taken before the temperature change of the substrate takes place due to the temperature change of the temperature control medium passes by from the change timing.

15 Claims, 12 Drawing Sheets

(52) U.S. Cl.
CPC ............ *G05B 2219/45031* (2013.01); *G05B 2219/50333* (2013.01); *H01J 2237/334* (2013.01)

(58) Field of Classification Search
CPC ........... H01L 21/6831; H01L 21/67103; H01L 21/67069; H01L 21/68785
See application file for complete search history.

(56) References Cited

U.S. PATENT DOCUMENTS

| | | | |
|---|---|---|---|
| 2012/0273162 A1* | 11/2012 | Mahadeswaraswamy | H01L 21/67109 165/61 |
| 2014/0262199 A1* | 9/2014 | Kobayashi | H01L 21/67248 165/61 |
| 2018/0173255 A1* | 6/2018 | Wetzel | G05D 23/2401 |
| 2019/0198299 A1* | 6/2019 | Watanabe | H01L 21/67115 |
| 2019/0385828 A1* | 12/2019 | Singhal | H01L 21/31122 |
| 2021/0143037 A1* | 5/2021 | Smith | H01L 21/68771 |

* cited by examiner

SUBSTRATE PROCESSING APPARATUS AND SUBSTRATE TEMPERATURE CORRECTION METHOD

CROSS-REFERENCE TO RELATED APPLICATION

This application claims the benefit of Japanese Patent Application Nos. 2021-029629 and 2022-003438 filed on Feb. 26, 2021 and Jan. 13, 2022, respectively, the entire disclosures of which are incorporated herein by reference.

TECHNICAL FIELD

The various aspects and embodiments described herein pertain generally to a substrate processing apparatus and a substrate temperature correction method.

BACKGROUND

Patent Document 1 proposes a technique of changing a temperature of a substrate by supplying a temperature control medium of a first temperature and a temperature control medium of a second temperature into a flow path of a placing table for placing the substrate thereon while switching them. Patent Document 2 proposes a technique of adjusting a temperature of a substrate by supplying a temperature control medium regulated to a first temperature by a low-temperature control unit and a temperature control medium regulated to a second temperature higher than the first temperature by a high-temperature control unit into a flow path of a placing table while adjusting a mixing ratio therebetween.

Patent Document 1: Japanese Patent Laid-open Publication No. 2020-120045

Patent Document 2: Japanese Patent Laid-open Publication No. 2013-105359

SUMMARY

In one exemplary embodiment, a substrate processing apparatus includes a placing table; a gas supply; a measurement unit; and a controller. The placing table is provided with a placing surface on which a substrate is placed, a flow path formed inside to allow a temperature control medium to flow therein, and a discharge opening through which a heat transfer gas is discharged to the placing surface. The gas supply is configured to supply the heat transfer gas from the discharge opening. The measurement unit is configured to measure a temperature of the temperature control medium flown into the flow path. The controller is configured to control, when the temperature of the temperature control medium measured by the measurement unit is changed by equal to or more than a predetermined temperature at a change timing, a pressure of the heat transfer gas supplied from the gas supply to eliminate a temperature change of the substrate caused by a temperature change of the temperature control medium after a predetermined time taken before the temperature change of the substrate placed on the placing surface takes place due to the temperature change of the temperature control medium passes by from the change timing.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
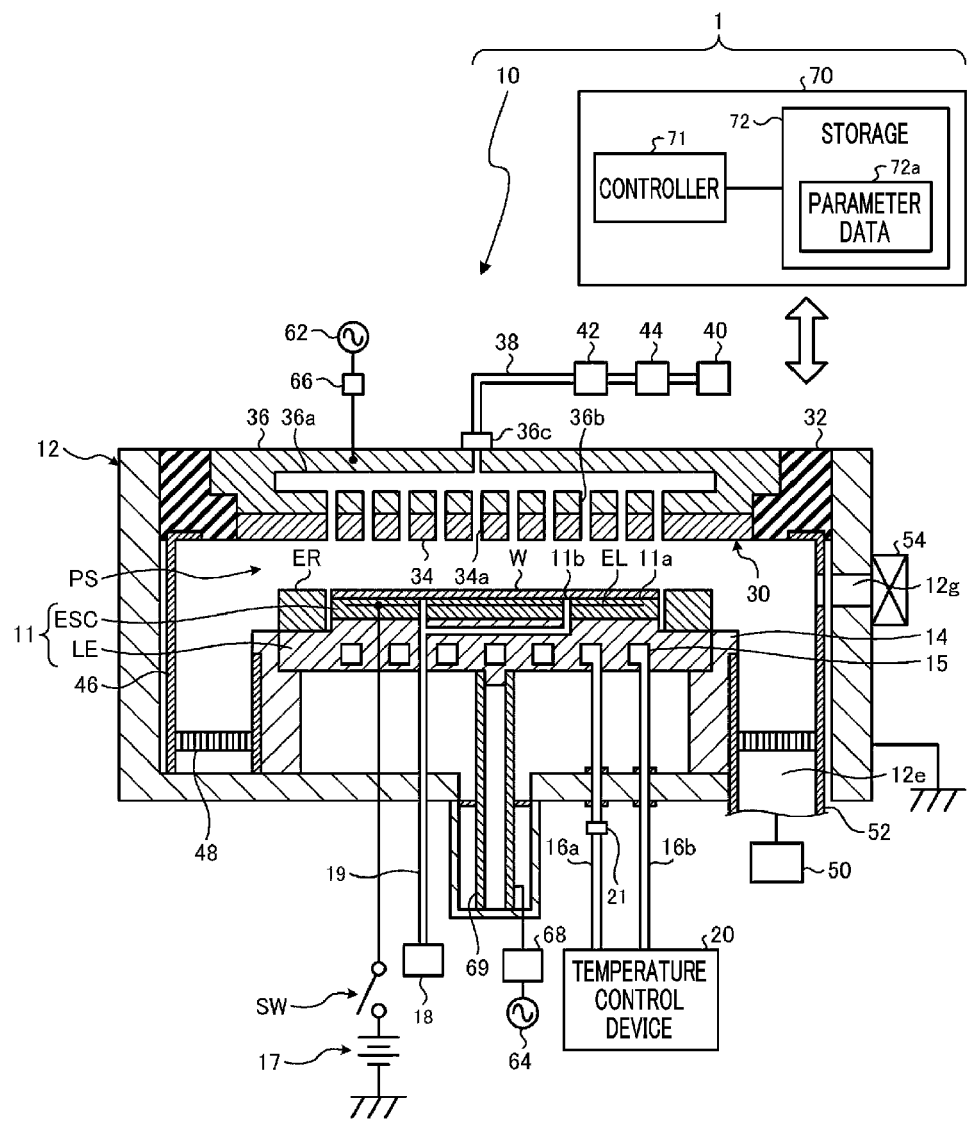
FIG. 1 is a schematic cross sectional view illustrating an example of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus and a substrate temperature correction method according to the present disclosure will be described in detail with reference to the drawings. Here, it should be noted that the substrate processing apparatus and the substrate temperature correction method are not limited by the following exemplary embodiments.

When changing a temperature of a placing table by changing a temperature of a temperature control medium flown into a flow path of the placing table in order to change a temperature of a substrate, the temperature of the substrate may be changed by being affected by the temperature change of the temperature control medium. For example, the temperature of the temperature control medium stored in a tank for storing therein the temperature control medium may be changed due to the temperature control medium returned into the tank at the time of changing the temperature of the temperature control medium, and the temperature of the substrate may also be changed by being affected by this temperature change of the temperature control medium supplied from the tank. Further, when adjusting the temperature of the temperature control medium by adjusting a mixing ratio of the temperature control medium, it is difficult to adjust the mixing ratio such that the temperature is maintained constant. As a result, the temperature of the temperature control medium may be changed, and the temperature of the substrate may also be changed by being affected by this temperature change of the temperature control medium.

The temperature change of the substrate may have an influence on a substrate processing. In view of this, the present disclosure provides a technique capable of suppressing the temperature change of the substrate which is caused by the temperature change of the temperature control medium.

EXEMPLARY EMBODIMENTS (Configuration of Substrate Processing Apparatus 1)

An example of a substrate processing apparatus of the present disclosure will be described. A substrate processing apparatus 1 according to an exemplary embodiment will be first explained. The substrate processing apparatus 1 is configured to perform a substrate processing on a substrate W. The following exemplary embodiment will be described for a case where the substrate processing apparatus 1 is a plasma processing apparatus and a plasma processing such as plasma etching is performed on the substrate W as the substrate processing. FIG. 1 is a schematic cross sectional view illustrating an example of the substrate processing apparatus 1 according to the exemplary embodiment. In the present exemplary embodiment, the substrate processing apparatus 1 is, for example, a plasma etching apparatus including parallel plate type electrodes. The substrate processing apparatus 1 includes an apparatus main body 10 and a control device 70. The apparatus main body 10 is made of a material such as, but not limited to, aluminum, and includes a processing vessel 12 having a substantially cylindrical shape, for example. The processing vessel 12 has an anodically oxidized inner wall. Further, the processing vessel 12 is frame-grounded.

A substantially cylindrical support 14 made of an insulating material such as, but not limited to quartz is provided on a bottom of the processing vessel 12. Within the processing vessel 12, the support 14 extends in a vertical direction (for example, toward an upper electrode 30) from the bottom of the processing vessel 12.

A placing table 11 is provided in the processing vessel 12. The placing table 11 is supported by the support 14. A placing surface 11a, on which the substrate W such as a semiconductor wafer is to be placed, is formed on a center of a top surface of the placing table 11. The substrate W is placed on the placing surface 11a of the placing table 11. The placing table 11 is configured to hold the substrate W placed on the placing surface 11a. The placing table 11 includes an electrostatic chuck ESC and a lower electrode LE. The lower electrode LE is made of a metal material such as, but not limited to, aluminum, and has a substantially disk shape. The electrostatic chuck ESC is disposed on the lower electrode LE. A top surface of the electrostatic chuck ESC serves as the placing surface 11a.

The electrostatic chuck ESC has a structure in which an electrode EL, which is a conductive film, is disposed between a pair of insulating layers or between a pair of insulating sheets. A DC power supply 17 is electrically connected to the electrode EL via a switch SW. The electrostatic chuck ESC is configured to attract the substrate W onto the top surface thereof by an electrostatic force such as a Coulomb force generated by a DC voltage supplied from the DC power supply 17. Thus, the electrostatic chuck ESC can hold the substrate W.

A discharge opening 11b through which a heat transfer gas is discharged is formed at the placing surface 11a of the placing table 11. The heat transfer gas such as, but not limited to, a He gas is supplied to the discharge opening 11b through a pipeline 19. The pipeline 19 is connected to a gas supply 18. The gas supply 18 is configured to supply the heat transfer gas into the pipeline 19. The heat transfer gas supplied through the pipeline 19 is discharged from the discharge opening 11b to be supplied into a gap between the electrostatic chuck ESC and the substrate W. By adjusting a pressure of the heat transfer gas supplied into the gap between the electrostatic chuck ESC and the substrate W, thermal conductivity between the electrostatic chuck ESC and the substrate W can be adjusted.

An edge ring ER is disposed around the electrostatic chuck ESC to surround an edge of the substrate W and the electrostatic chuck ESC. The edge ring ER may also be called a focus ring. The edge ring ER enables to improve in-surface uniformity of the processing upon the substrate W. The edge ring ER is made of a material, such as quartz, for example, which is appropriately selected based on a material of an etching target film.

Formed inside the lower electrode LE is a flow path 15 through which a temperature control medium, which is an insulating fluid such as Galden (registered trademark), flows. A temperature control device 20 is connected to the flow path 15 via a pipeline 16a and a pipeline 16b. The temperature control device 20 controls a temperature of the temperature control medium flowing in the flow path 15 of the lower electrode LE. The temperature control medium, which is temperature-controlled by the temperature control device 20, is supplied into the flow path 15 of the lower electrode LE via the pipeline 16a. The temperature control medium flowing in the flow path 15 is returned back to the temperature control device 20 via the pipeline 16b.

The temperature control device 20 is configured to switch a temperature control medium of a first temperature and a temperature control medium of a second temperature, and configured to supply it into the flow path 15 of the lower electrode LE. As the temperature control medium of the first temperature and the temperature control medium of the second temperature are supplied into the flow path 15 of the lower electrode LE while being switched, the temperature of the electrode LE is switched between the first temperature and the second temperature. Accordingly, the temperature of the placing table 11 is also switched between the first temperature and the second temperature. The first temperature is a temperature equal to or lower than, e.g., 0° C. The second temperature is a temperature equal to or higher than, for example, a room temperature.

A temperature sensor 21 is provided in the pipeline 16a. The temperature sensor 21 is configured to measure the temperature of the temperature control medium flowing through the pipeline 16a.

A power feed line 69 configured to supply a high frequency power to the lower electrode LE is electrically connected to a bottom surface of the lower electrode LE. The power feed line 69 is made of a metal. In addition, although not shown in FIG. 1, lifter pins for performing a delivery of the substrate W on the electrostatic chuck ESC and a driving mechanism for the lifter pins are disposed in a space between the lower electrode LE and the bottom of the processing vessel 12.

A first high frequency power supply 64 is connected to the power feed line 69 via a matching device 68. The first high frequency power supply 64 is a power supply configured to generate a high frequency power for ion attraction into the substrate W, i.e., a high frequency bias power. As an example, the first high frequency power supply 64 generates the high frequency bias power having a frequency ranging from 400 kHz to 40.68 MHz, for example, 13.56 MHz. The matching device 68 is a circuit configured to match an output impedance of the first high frequency power supply 64 and an input impedance at a load (lower electrode LE) side. The high frequency bias power generated by the first high frequency power supply 64 is supplied to the lower electrode LE via the matching device 68 and the power feed line 69.

An upper electrode 30 is disposed above the placing table 11, facing the placing table 11. The lower electrode LE and the upper electrode 30 are arranged to be substantially parallel to each other. Plasma is formed in a space between the upper electrode 30 and the lower electrode LE, and a plasma processing such as etching is performed on the substrate W held on the top surface of the electrostatic chuck ESC by the formed plasma. The space between the upper electrode 30 and the lower electrode LE is a processing space PS.

The upper electrode 30 is supported at an upper portion of the processing vessel 12 with an insulating shield member 32 made of, for example, quartz therebetween. The upper electrode 30 has an electrode plate 34 and an electrode supporting body 36. A bottom surface of the electrode plate 34 is in direct contact with the processing space PS. The electrode plate 34 is provided with a multiple number of gas discharge openings 34a. The electrode plate 34 is made of, for example, a silicon-containing material.

The electrode supporting body 36 is made of a conductive material such as, but not limited to, aluminum and configured to support the electrode plate 34 from above in a detachable manner. The electrode supporting body 36 may have a non-illustrated water-cooling structure. A diffusion space 36a is provided within the electrode supporting body 36. A multiple number of gas holes 36b are extended downwards (towards the placing table 11) from the diffusion space 36a to communicate with the gas discharge holes 34a of the electrode plate 34, respectively. The electrode supporting body 36 is provided with a gas inlet port 36c through which a processing gas is introduced into the diffusion space 36a, and a pipeline 38 is connected to the gas inlet port 36c.

A gas source group 40 is connected to the pipeline 38 via a valve group 42 and a flow rate controller group 44. The gas source group 40 has a plurality of gas sources. The valve group 42 includes a plurality of valves, and the flow rate controller group 44 includes a plurality of flow rate controllers such as mass flow controllers. Each of the gas sources belonging to the gas source group 40 is connected to the pipeline 38 via a corresponding valve belonging to the valve group 42 and a corresponding flow rate controller belonging to the flow rate controller group 44.

With this configuration, the apparatus main body 10 is capable of supplying the processing gas from one or more gas sources selected from the gas source group 40 into the diffusion space 36a within the electrode supporting body 36 at an individually adjusted flow rate. The processing gas supplied into the diffusion space 36a is diffused in the diffusion space 36a to be supplied into the processing space PS in a shower shape through the gas holes 36b and the gas discharge openings 34a.

A second high frequency power supply 62 is connected to the electrode supporting body 36 via a matching device 66. The second high frequency power supply 62 is a power supply configured to generate a high frequency power for plasma formation, and generates a high frequency power having a frequency ranging from, e.g., 27 MHz to 100 MHz, for example, 60 MHz. The matching device 66 is a circuit configured to match an output impedance of the second high frequency power supply 62 with the input impedance at the load (upper electrode 30) side. The high frequency power generated by the second high frequency power supply 62 is supplied to the upper electrode 30 via the matching device 66. Further, the second high frequency power supply 62 may be connected to the lower electrode LE via the matching device 66.

A deposition shield 46 made of aluminum or the like whose surface is coated with $Y_2O_3$, quartz, or the like is provided on an inner wall surface of the processing vessel 12 and an outer side surface of the support 14 in a detachable manner. The deposition shield 46 serves to suppress etching byproducts (deposits) from adhering to the processing vessel 12 and the support 14.

At a bottom side of the processing vessel 12 (where the support 14 is provided), an exhaust plate 48 is provided between an outer sidewall of the support 14 and an inner sidewall of the processing vessel 12. The exhaust plate 48 is made of, for example, aluminum whose surface is coated with $Y_2O_3$, quartz, or the like. An exhaust port 12e is provided below the exhaust plate 48. An exhaust device 50 is connected to the exhaust port 12e via an exhaust line 52.

The exhaust device 50 includes a vacuum pump such as a turbo molecular pump. The exhaust device 50 is capable of decompressing the space within the processing vessel 12 to a required vacuum degree. An opening 12g through which the wafer W is carried in or out is provided at a sidewall of the processing vessel 12, and the opening 12g is opened or closed by a gate valve 54.

The control device 70 is, for example, a computer. An operation of the apparatus main body 10 configured as described above is controlled by the control device 70 in overall. The control device 70 includes a controller 71 and a storage 72. Further, the control device 70 may also include a display configured to display various kinds of information such as a processing status and a manipulation unit such as a keyboard configured to perform various kinds of input operations.

The storage 72 is a storage device that stores various types of data therein. For example, the storage 72 may be a storage device such as a hard disk, a solid state drive (SSD), or an optical disk. Further, the storage 72 may be a semiconductor memory such as a random access memory (RAM), a flash memory, and a non-volatile static random access memory (NVSRAM) in which data can be rewritten.

The storage 72 stores therein an operating system (OS) and various programs executed by the controller 71. For example, the storage 72 stores therein various programs including a program for implementing a processing of a substrate temperature correction method to be described later. Further, the storage 72 stores therein various data used in the program executed by the controller 71. By way of example, the storage 72 stores parameter data 72a. In addition to the data mentioned above, the storage 72 may store other data as well.

The parameter data 72a is data in which parameter values to be described later are stored for each processing condition of the plasma processing. Details of the parameter data 72a will be described later.

The controller 71 is a device such as a processor configured to control the individual components of the apparatus main body 10. An electronic circuit such as a CPU (Central Processing Unit) or an MPU (Micro Processing Unit), or an integrated circuit such as an ASIC (Application Specific Integrated Circuit) or FPGA (Field Programmable Gate Array) may be adopted as the controller 71. The controller 71 has an internal memory for storing control data or a program defining various processing sequences, and various processings are performed by these control data or the program. The controller 71 controls the individual components of the apparatus main body 10 by reading out the program stored in the storage 72 into a memory and executing the program with the processor, thus allowing the plasma processing to be performed. Moreover, the controller 71 performs the processing of the substrate temperature correction method according to the exemplary embodiment.

(Configuration of Temperature Control Device 20)

Figure 2:
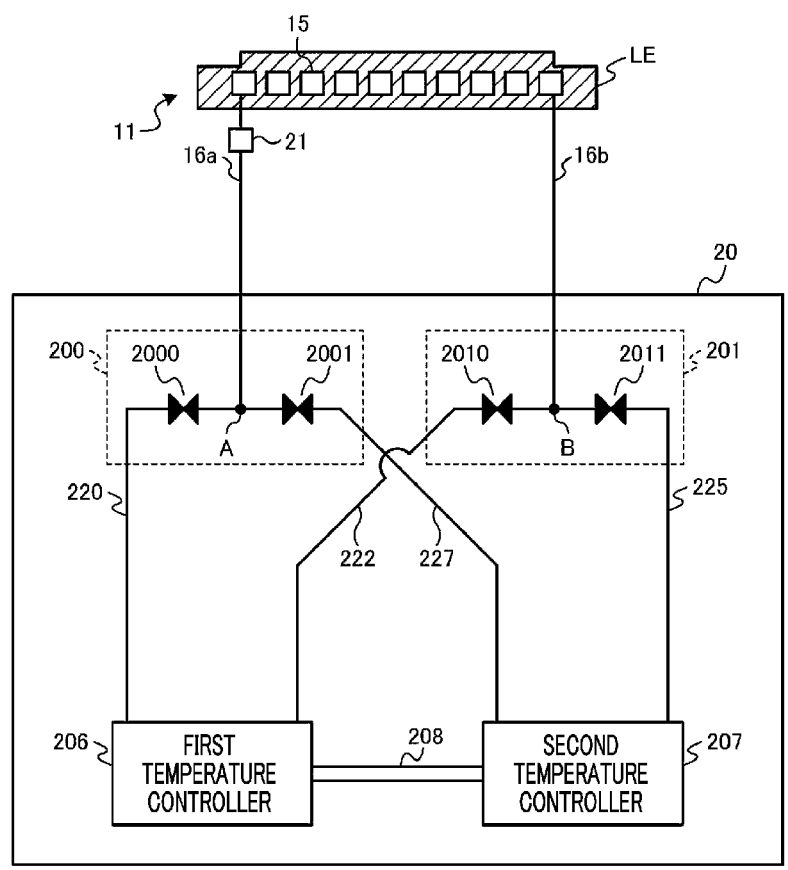
FIG. 2 is a diagram illustrating an example of a schematic configuration of a temperature control device according to the exemplary embodiment.

Next, a schematic configuration of the temperature control device 20 will be described. FIG. 2 is a diagram showing an example of the schematic configuration of the temperature control device 20 according to the exemplary embodiment.

The temperature control device 20 has a first switching unit 200, a second switching unit 201, a first temperature controller 206, and a second temperature controller 207.

The first temperature controller 206 is connected to the pipeline 16a via a pipeline 220. Further, the first temperature controller 206 is connected to the pipeline 16b via a pipeline 222. The first temperature controller 206 controls a temperature of a temperature control medium to a first temperature. For example, the first temperature controller 206 has a tank for storing the temperature control medium therein, and controls the temperature of the temperature control medium to the first temperature by controlling the temperature of the tank. The first temperature controller 206 supplies the temperature control medium of the first temperature from the tank into the flow path 15 of the lower electrode LE via the pipeline 220 and the pipeline 16a. The temperature control medium supplied into the flow path 15 of the lower electrode LE is returned back into the tank of the first temperature controller 206 via the pipeline 16b and the pipeline 222.

The second temperature controller 207 is connected to the pipeline 16a and the pipe 220 at a connection point A via a pipeline 227. Moreover, the second temperature controller 207 is connected to the pipeline 16b and the pipeline 222 at a connection point B via a pipeline 225. The second temperature controller 207 controls the temperature of the temperature control medium to a second temperature higher than the first temperature. By way of example, the second temperature controller 207 has a tank for storing the temperature control medium therein, and controls the temperature of the temperature control medium to the second temperature by controlling the temperature of the tank. The second temperature controller 207 supplies the temperature control medium of the second temperature from the tank into the flow path 15 of the lower electrode LE via the pipeline 227 and the pipeline 16a. The temperature control medium supplied into the flow path 15 of the lower electrode LE is returned back into the tank of the second temperature controller 207 via the pipeline 16b and the pipeline 225.

The first temperature controller 206 and the second temperature controller 207 are connected by a pipeline 208. The pipeline 208 adjusts a liquid surface of the tank in the first temperature controller 206 storing the temperature control medium and a liquid surface of the tank in the second temperature controller 207 storing the temperature control medium. Thus, leakage of the temperature control medium is suppressed.

The first switching unit 200 is provided at a connection portion where the pipeline 220 and the pipeline 227 are connected to the pipeline 16a. The first switching unit 200 is configured to switch the temperature control medium flowing in the flow path 15 of the lower electrode LE. The first switching unit 200 has a first supply valve 2000 and a second supply valve 2001. The first supply valve 2000 is provided at a portion of the pipeline 200 near the connection point A between the pipeline 220 and the pipeline 16a. The second supply valve 2001 is provided at a portion of the pipeline 227 near the connection point A between the pipeline 227 and the pipeline 16a.

The second switching unit 201 is provided at a connection portion where the pipeline 222 and the pipeline 225 are connected to the pipeline 16b. The second switching unit 201 is configured to switch an output destination of the temperature control medium flowing out from the flow path 15 of the lower electrode LE to the first temperature controller 206 or the second temperature controller 207. The second switching unit 201 includes a first return valve 2010 and a second return valve 2011. The first return valve 2010 is provided at a portion of the pipeline 222 near the connection point B between the pipeline 222 and the pipeline 16b. The second return valve 2011 is provided at a portion of the pipeline 225 near the connection point B between the pipeline 225 and the pipeline 16b.

In the present exemplary embodiment, the first supply valve 2000, the second supply valve 2001, the first return valve 2010, and the second return valve 2011 are all two-way valves that can be switched between an open state and a closed state. The opening and closing of the first supply valve 2000, the second supply valve 2001, the first return valve 2010, and the second return valve 2011 are respectively controlled by the controller 71.

In addition, although the configuration of the temperature control device 20 is schematically illustrated in FIG. 2, the configuration of the temperature control device 20 is not limited thereto. For example, the temperature control device 20 may have a configuration in which water hammer can be suppressed, as in Patent Document 1.

(Switching Operation of Temperature Control Medium)

Figure 3A:
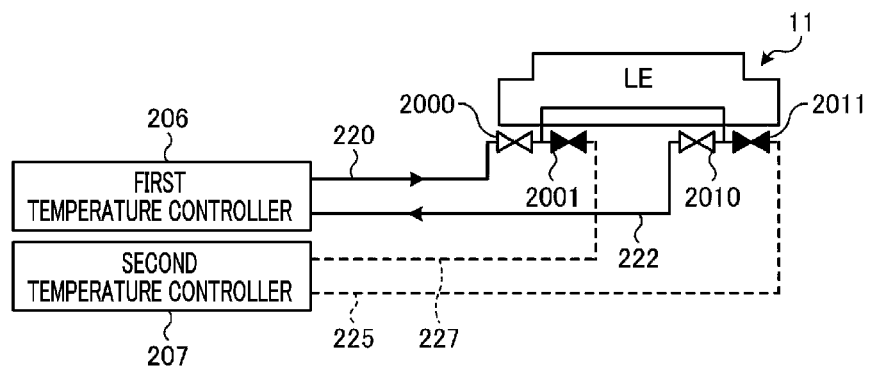
FIG. 3A is a diagram for describing a temperature control medium switching operation by the temperature control device according to the exemplary embodiment.
Figure 3B:
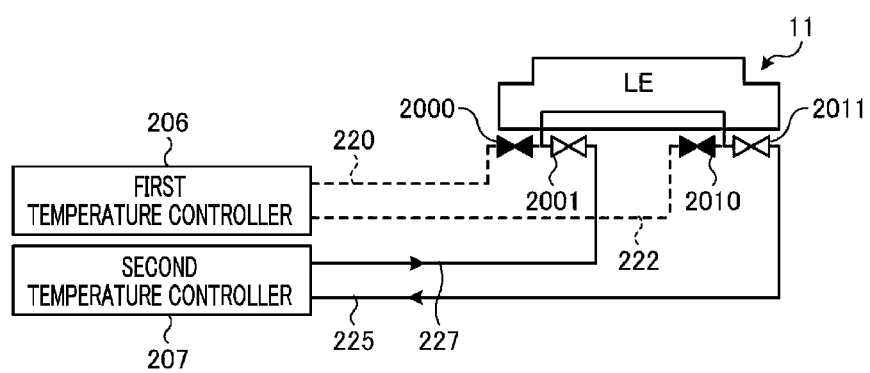
FIG. 3B is a diagram for describing a temperature control medium switching operation by the temperature control device according to the exemplary embodiment.

FIG. 3A and FIG. 3B are diagrams for describing a switching operation of the temperature control medium by the temperature control device 20 according to the exemplary embodiment. In FIG. 3A and FIG. 3B, open valves is drawn in white, and closed valves are drawn in black.

The first temperature controller 206 controls the temperature of the temperature control medium to the first temperature. The second temperature controller 207 controls the temperature of the temperature control medium to the second temperature higher than the first temperature.

When circulating the temperature control medium of the first temperature through the flow path 15, the controller 71 controls the first supply valve 2000 and the first return valve 2010 to be in an open state, and controls the second supply valve 2001 and the second return valve 2011 to be in a closed state. Accordingly, as shown in FIG. 3A, the temperature control medium of the first temperature is outputted from the first temperature controller 206, and supplied into the flow path 15 of the lower electrode LE via the pipeline 220, the first supply valve 2000, and the pipeline 16a. Further, the temperature control medium supplied into the flow path 15 of the lower electrode LE is returned back into the first temperature controller 206 via the pipeline 16b, the first return valve 2010, and the pipeline 222. As a result, the placing table 11 is controlled to the first temperature.

Meanwhile, when circulating the temperature control medium of the second temperature through the flow path 15, the controller 71 controls the first supply valve 2000 and the first return valve 2010 to be in the closed state, and controls the second supply valve 2001 and the second return valve 2011 to be in the open state. Accordingly, as shown in FIG. 3B, the temperature control medium of the second temperature is outputted from the second temperature controller 207, and supplied into the flow path 15 of the lower electrode LE via the pipeline 227, the second supply valve 2001, and the pipeline 16a. In addition, the temperature control medium supplied into the flow path 15 of the lower electrode LE is returned back into the second temperature controller 207 via the pipeline 16b, the second return valve 2011, and the pipeline 225. As a result, the placing table 11 is controlled to the second temperature.

However, when changing the temperature of the placing table 11 by changing the temperature of the temperature control medium flown into the flow path 15 in order to change the temperature of the substrate W, the temperature of the substrate W may be changed by being affected by the temperature change of the temperature control medium.

For example, when changing the temperature of the temperature control medium to be flown into the flow path 15 of the placing table 11 from the first temperature to the second temperature, the controller 71 switches the opening and closing of the first supply valve 2000, the second supply valve 2001, the first return valve 2010, and the second return valve 2011 from the state of FIG. 3A to the state of FIG. 3B. In this case, when such switching operations of the valves are performed, the temperature control medium of the first temperature remaining in the flow path 15 flows into the tank of the second temperature controller 207, causing the temperature of the temperature control medium in the tank to be decreased from the second temperature. The second temperature controller 207 is controlling the temperature of the tank. Accordingly, with the lapse of time, the temperature of the temperature control medium in the tank returns to the second temperature. During a period in which the temperature of the temperature control medium in the tank is decreased from the second temperature, the temperature of the temperature control medium supplied from the second temperature controller 207 to the flow path 15 of the placing table 11 is temporarily decreased from the second temperature.

Further, when changing the temperature of the temperature control medium to be flown into the flow path 15 of the placing table 11 from the second temperature to the first temperature, the controller 71 switches the opening and closing of the first supply valve 2000, the second supply valve 2001, the first return valve 2010, and the second return valve 2011 from the state of FIG. 3B to the state of FIG. 3A. In this case, when such switching operations of the valves are performed, the temperature control medium of the second temperature remaining in the flow path 15 flows into the tank of the first temperature controller 206, causing the temperature of the temperature control medium in the tank to be increased from the first temperature. At this time, the first temperature controller 206 is controlling the temperature of the tank. Accordingly, with the lapse of time, the temperature of the temperature control medium being supplied returns to the first temperature. During a period in which the temperature of the temperature control medium in the tank is increased from the first temperature, the temperature of the temperature control medium supplied from the first temperature controller 206 to the flow path 15 of the placing table 11 is temporarily increased from the first temperature.

Figure 4:
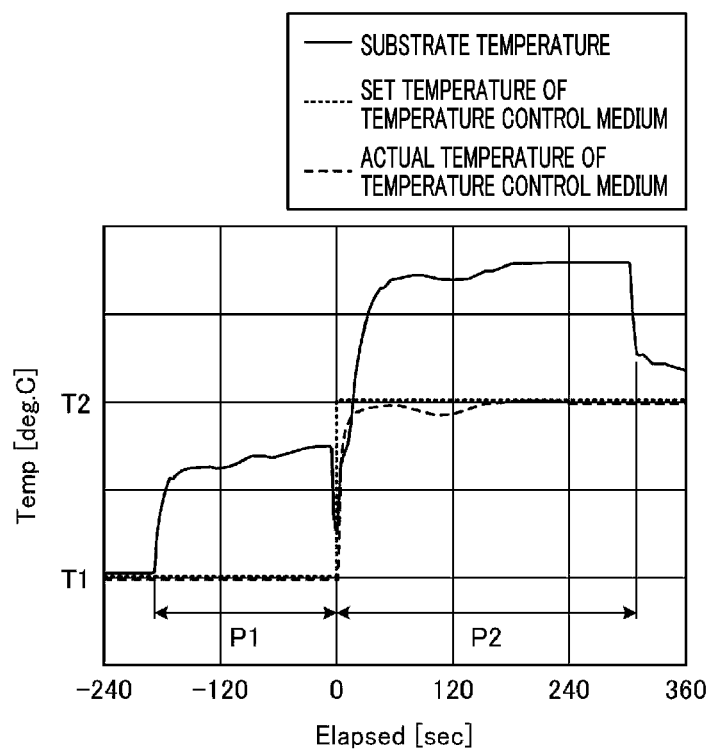
FIG. 4 is a graph showing an example of temperature variations of the temperature control medium and a substrate.

An example of the temperature change of the substrate W affected by the temperature change of the temperature control medium flown into the flow path 15 of the placing table 11 will be described. FIG. 4 is a graph showing an example of temperature variations of the temperature control medium and the substrate W according to the exemplary embodiment. FIG. 4 illustrate a case where the substrate processing apparatus 1 performs a second plasma processing on the substrate by flowing the temperature control medium of the second temperature into the flow path 15 of the placing table 11 after performing a first plasma processing thereon by flowing the temperature control medium of the first temperature into the flow path 15 of the placing table 11. FIG. 4 shows waveforms of a variation of the temperature of the substrate W, a variation of an actual temperature of the temperature control medium supplied to the flow path 15 of the placing table 11, and a variation of a set temperature of the temperature control medium. The "set temperature of the temperature control medium" indicates an ideal temperature of the temperature control medium flowing through the flow path 15 of the placing table 11. Further, FIG. 4 shows a period P1 in which the first plasma processing is performed and a period P2 in which the second plasma processing is performed by supplying the high frequency powers, respectively.

The temperature control device 20 circulates the temperature control medium of the first temperature through the flow path 15 of the placing table 11 before the period P1 of the first plasma processing. The temperature of the substrate W is maintained at a first temperature T1 before the period P1 of the first plasma processing, and then, it is increased from the first temperature T1 in the period P1 because there is a heat input from the plasma.

When switching the first plasma processing to the second plasma processing, the temperature control device 20 switches the temperature control medium being supplied from the temperature control medium of the first temperature to the temperature control medium of the second temperature. In FIG. 4, the set temperature of the temperature control medium is switched from the first temperature T1 to the second temperature T2 between the period P1 and the period P2. The actual temperature of the temperature control medium supplied to the flow path 15 of the placing table 11 is rapidly increased to the second temperature T2 as a result of this switching of the set temperature and is temporarily stabilized near the temperature T2. However, the actual temperature of the temperature control medium is temporarily decreased from the second temperature T2 by being affected by the temperature control medium of the first temperature remaining in the flow path 15. Although the temperature of the substrate W is increased due to the heat input from the plasma in the period P2 and is temporarily stabilized, the temperature of the substrate W may be temporarily decreased under the influence of the temporary decrease in the temperature of the temperature control medium.

Figure 5:
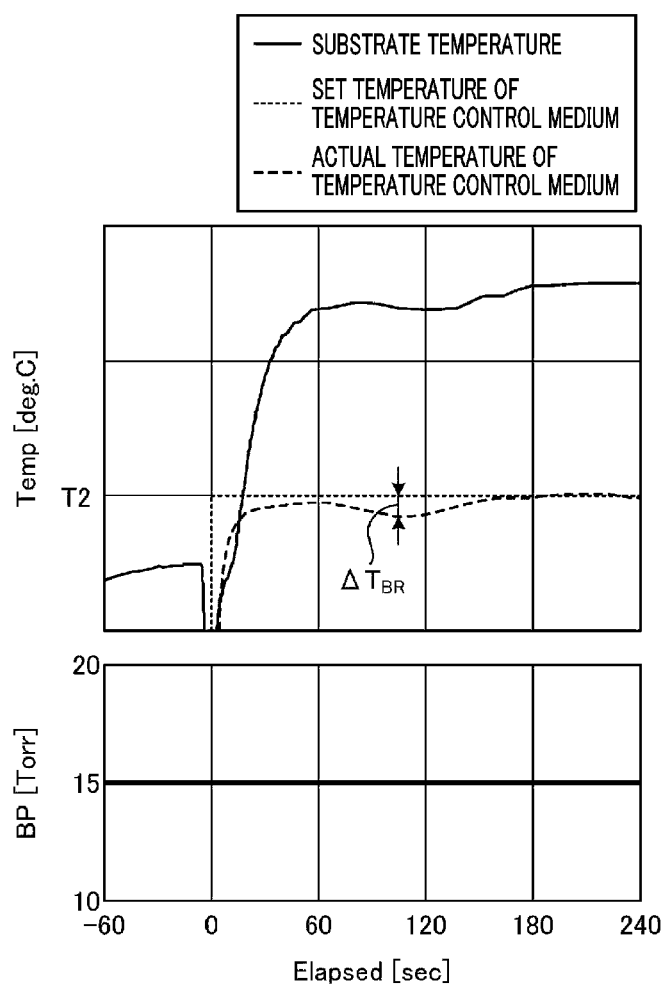
FIG. 5 is a graph showing an example of temperature variations of the temperature control medium and the substrate.

FIG. 5 is a graph showing an example of the temperature variations of the temperature control medium and the substrate according to the exemplary embodiment. An upper part of FIG. 5 is an enlarged view illustrating a portion of FIG. 4 where the temporary temperature decreases of the temperature control medium and the substrate W take place. Further, a change in a pressure BP of the heat transfer gas is also shown in a lower part of FIG. 5. In FIG. 5, the gas supply 18 supplies the heat transfer gas at the constant pressure BP. The temperature of the temperature control medium is transferred to the substrate W via the placing table 11. For the reason, the change in the temperature of the temperature control medium is transferred to the substrate W with a time delay. Accordingly, the temporary decrease of the temperature of the substrate W takes place while being delayed from the temporary decrease of the temperature of the temperature control medium. This change in the temperature of the substrate W affects a process of the second plasma processing.

As shown in FIG. 4 and FIG. 5, after the temperature change of the temperature control medium occurs, there is a time delay before the temperature change of the substrate W takes place. For this reason, it is too early to correct the pressure BP of the heat transfer gas immediately after the temperature change of the temperature control medium takes place. Thus, by performing the correction of the pressure BP of the heat transfer gas after the lapse of a predetermined time Δwt, which is taken before the temperature of the substrate W is changed by being affected by the temperature change of the temperature control medium, from a timing when the temperature of the temperature control medium has changed, precision can be further improved.

Figure 6:
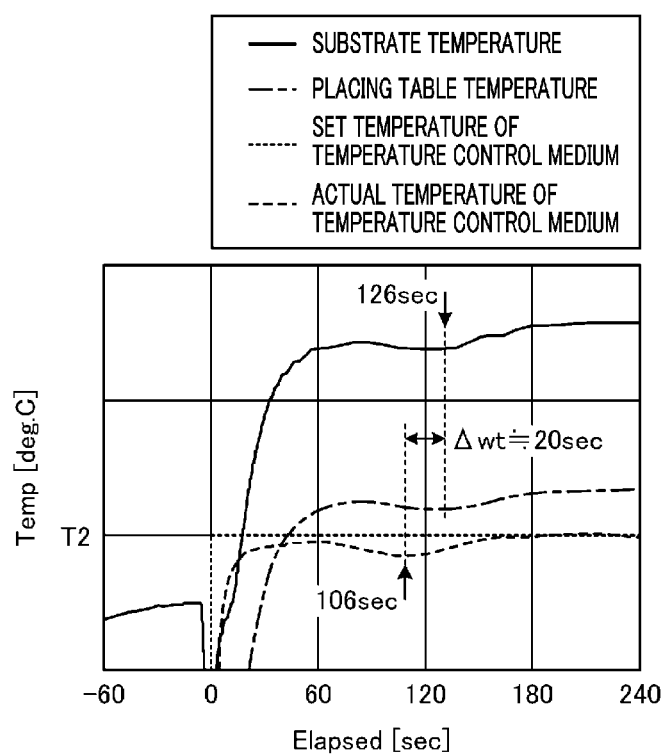
FIG. 6 is a diagram for describing an example of a method of calculating a predetermined time according to the exemplary embodiment.

The predetermined time Δwt may be empirically determined. For example, the predetermined time Δwt may be set by measuring a time taken before the temperature change of the substrate W takes place after the temperature of the temperature control medium is changed, by using the substrate processing apparatus 1 or an apparatus (for example, an experimental plasma processing apparatus) having the same characteristics as the substrate processing apparatus 1. FIG. 6 is a diagram for describing an example of a method of calculating the predetermined time Δwt according to the exemplary embodiment. FIG. 6 shows the waveforms of the variation of the temperature of the substrate W, the variation of the actual temperature of the temperature control medium supplied to the flow path 15 of the placing table 11, and the variation of the set temperature of the temperature control medium shown in FIG. 5. Further, FIG. 6 also shows a waveform of a temperature variation of the placing table 11. The temperature variation of substrate W and the temperature variation of the placing table 11 are almost synchronized. An elapsed time in which the actual temperature of the temperature control medium is temporarily reduce the most is calculated from the waveform of the variation of the actual temperature of the temperature control medium. Further, an elapsed time in which the temperature of the substrate W or the placing table 11 is temporarily reduced the most is calculated from the waveform of the temperature variation of the substrate W or the waveform of the temperature variation of the placing table 11. Then, by calculating a difference between the elapsed time in which the actual temperature of the temperature control medium is temporarily reduced the most and the elapsed time in which the temperature of the substrate W or the placing table 11 is temporarily reduced the most, the predetermined time Δwt is obtained. In the example of FIG. 6, the elapsed time in which the actual temperature of the temperature control medium is temporarily reduced the most is 106 sec, and the elapsed time in which the temperature of the substrate W or the placing table 11 is temporarily reduced the most is 126 sec. Thus, the predetermined time Δwt is calculated to be about 20 sec.

Alternatively, the predetermined time Δwt may be theoretically decided. For example, the predetermined time Δwt can be calculated from the following expression (1).

$$\Delta wt = t1 + t2 - t3 \quad (1)$$

Here, t1 denotes a delay time which is dependent on a volume of a pipeline; t2, a time taken for the heat transfer from the temperature control medium to the substrate W; and t3, a time taken before the pressure BP is actually changed after the gas supply 18 receives an instruction to change the pressure of the heat transfer gas.

To elaborate, t1 is a time taken before the temperature control medium remaining in the flow path 15 or the like flows out. The time t1 is determined based on installation positions of the flow path 15, the pipe lines 16a and 16b, and the temperature sensor 21. By way of example, a length from the installation position of the temperature sensor 21 of the pipeline 16a to an end of the pipeline 16b having passed through the flow path 15 is referred to as L. A cross sectional area of the inside of the flow path 15 and a cross sectional area of the inside of the pipe lines 16a and 16b are set to be same, and this cross sectional area of the inside thereof is referred to as S. A flow velocity of the temperature control medium is referred to as V. In this case, the time t1 is calculated by the following expression (2).

$$t1 = L \times S \div V \quad (2)$$

For example, when the length L is 4.5 m, the cross sectional area S is $2.85\mathrm{E}^{-4}$ m$^2$, and the flow velocity V of the temperature control medium is 0.5 L/sec, the time t1 is calculated as follows from the expression (2).

$$t1 = 4.5 \times 2.85E^{-4} \div 0.5 = 2.6 \text{ (sec)}$$

The time t2 is a time taken for the heat of the flow path 15 of the placing table 11 to be transferred to the substrate W, that is, a time constant τ, and it can be calculated from a thermal resistance and a thermal capacity between the flow path 15 of the placing table 11 and the substrate W. By way of example, the time t2 is calculated by the following expression (3) from the thermal resistance and the thermal capacity of each layer such as the electrostatic chuck ESC between the flow path 15 of the placing table 11 and the substrate W, the lower electrode LE portion, and the like.

$$t2 = \tau = \Sigma(\text{thermal resistance} \times \text{heat capacity}) \quad (3)$$

The time t3 is calculated by measuring a time taken before the pressure BP is actually changed after the gas supply 18 receives the instruction to change the pressure of the heat transfer gas, by using the actual substrate processing apparatus 1 or an apparatus having the same characteristics as the substrate processing apparatus 1 (for example, an experimental plasma processing apparatus).

Figure 7:
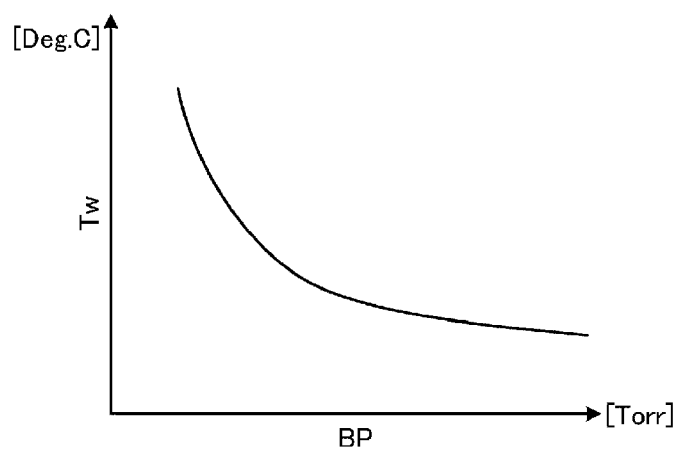
FIG. 7 is a diagram illustrating an example of a relationship between a pressure of a heat transfer gas and a temperature of the substrate according to the exemplary embodiment.

In the placing table 11, when the pressure of the heat transfer gas discharged from the discharge opening 11b increases, thermal conductivity between the electrostatic chuck ESC and the substrate W increases, resulting in a decrease of the temperature of the substrate W. In addition, in the placing table 11, when the pressure of the heat transfer gas discharged from the discharge opening 11b decreases, the thermal conductivity between the electrostatic chuck ESC and the substrate W decreases, resulting in an increase of the temperature of the substrate W. FIG. 7 is a diagram showing an example of a relationship between the pressure BP of the heat transfer gas and a temperature Tw of the substrate W according to the exemplary embodiment. FIG. 7 presents a PT curve showing the relationship between the pressure BP of the heat transfer gas and the temperature Tw of the substrate W. With an increase of the pressure BP of the heat transfer gas supplied from the gas supply 18, the temperature Tw of the substrate W decreases.

Figure 8:
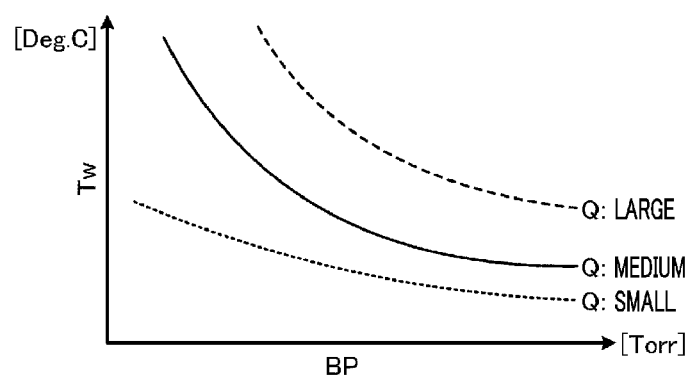
FIG. 8 is a diagram illustrating an example of a variation in a PT curve according to the amount of heat input from plasma to the substrate.

The relationship between the pressure BP of the heat transfer gas and the temperature Tw of the substrate W varies depending on an amount of the heat input from the plasma to the substrate W. FIG. 8 is a diagram illustrating an example of a variation of the PT curve in relation to an amount of a heat input Q from the plasma to the substrate W according to the exemplary embodiment. When the amount of the heat input Q from the plasma to the substrate W is larger, the whole PT curve is shifted upwards.

Figure 9:
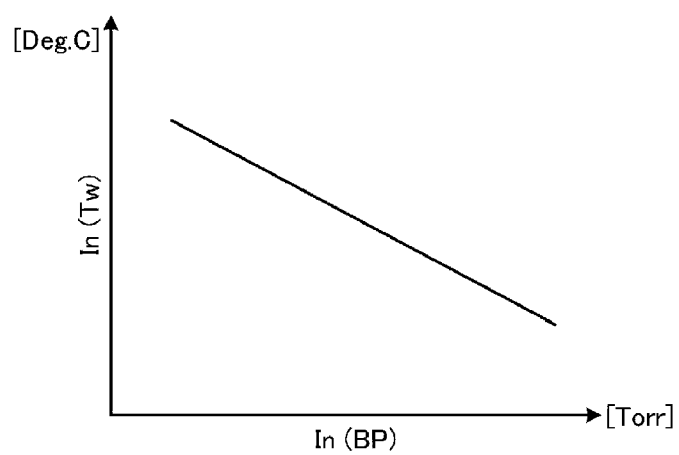
FIG. 9 is a diagram obtained by performing a logarithm of a vertical axis and a horizontal axis of FIG. 7.

FIG. 9 is a diagram in which the logarithm is taken on the vertical and the horizontal axes of FIG. 7. The PT curve showing the relationship between the pressure BP of the heat transfer gas and the temperature Tw of the substrate W as shown in FIG. 9 becomes to have a linear shape if the logarithm is respectively taken on the temperature Tw of the substrate W and the pressure BP of the heat transfer gas. Thus, the PT curve can be approximated by a logarithmic function. For example, the PT curve can be represented by the following expression (4-1), and the expression (4-2) can be derived from the expression (4-1).

$$ln(T) = a \times ln(P) + b \quad (4\text{-}1)$$

$$T = P^a \times e^b \quad (4\text{-}2)$$

Here, a and b are parameters. T denotes the temperature of the substrate W. P indicates the pressure of the heat transfer gas to be supplied.

Figure 10:
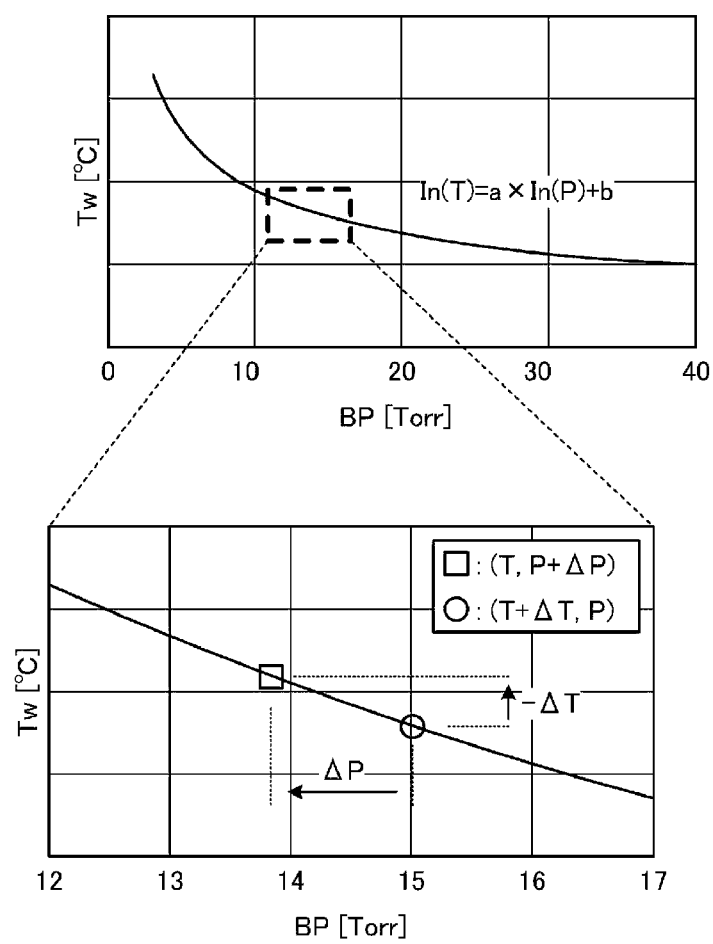
FIG. 10 is a diagram for describing an example of correction of the temperature of the substrate according to the exemplary embodiment.

Next, correction of the temperature of the substrate W will be explained. FIG. 10 is a diagram for describing an example of the correction of the temperature of the substrate W according to the exemplary embodiment. FIG. 10 shows the PT curve, and an enlarged view of a part of the PT curve is shown in the lower part of FIG. 10. When a supply temperature of the temperature control medium is changed by $\Delta T$ (° C.), the temperature Tw of the substrate W changes from T to T+$\Delta T$. In order to return the temperature Tw of the substrate W from T+$\Delta T$ to T, a correction amount of the pressure BP of the heat transfer gas is set to be $\Delta P$.

If (P, T+$\Delta T$) and (P+$\Delta P$, T) are put in the expression (4-2), the following expressions (5-1) and (5-2) are obtained.

$$T + \Delta T = P^a \times e^b \quad (5\text{-}1)$$

$$T = (P + \Delta P)^a \times e^b \quad (5\text{-}2)$$

If T is eliminated using the expressions (5-1) and (5-2), the following expression (6) is obtained.

$$(P + \Delta P)^a \times e^b + \Delta T\, P^a \times e^b \quad (6)$$

If the expression (6) is put as an expression regarding $\Delta P$, the following expression (7) is obtained.

$$\Delta P = (P^a - \Delta T/e^b)^{1/a} - P \quad (7)$$

Thus, if the parameters a and b are set, the correction amount $\Delta P$ of the pressure BP of the heat transfer gas for changing the temperature Tw of the substrate W by $\Delta T$ is calculated from the expression (7).

As shown in FIG. 8, the PT curve showing the relationship between the pressure BP of the heat transfer gas and the temperature Tw of the substrate W varies depending on the amount of the heat input Q from the plasma to the substrate W. The amount of the heat input Q from the plasma to the substrate W varies depending on processing conditions of the plasma processing. Thus, by acquiring the PT curve for each processing condition of the plasma processing in advance and obtaining the expression (4-2) that approximates each PT curve, the parameters a and b can be obtained in advance for each processing condition of the plasma processing.

The parameters a and b for each processing condition of the plasma processing are stored in parameter data 72a.

The controller 71 controls the pressure BP of the heat transfer gas from the gas supply 18 such that the temperature change of the substrate W due to the temperature change of the temperature control medium may be eliminated. By way of example, the controller 71 determines whether the temperature of the temperature control medium measured by the temperature sensor 21 has changed by equal to or more than a predetermined temperature. The predetermined temperature is set according to a range in which the temperature change of the temperature control medium is allowed. The predetermined temperature is, for example, 5° C. When the temperature of the temperature control medium is found to be changed by equal to more than the predetermined temperature at a change timing, the controller 71 controls the pressure BP of the heat transfer gas from the gas supply 18 so as to eliminate the temperature change of the substrate W due to the temperature change of the temperature control medium after the predetermined time $\Delta wt$ has elapsed from the change timing (the timing when the temperature of the temperature control medium is changed).

For example, when the temperature of the temperature control medium measured by the temperature sensor 21 has changed by equal to or more than the predetermined temperature from the first temperature while the temperature control medium of the first temperature is being supplied to the flow path 15 from the temperature control device 20, and, also, when the temperature of the temperature control medium measured by the temperature sensor 21 has changed by equal to or more than the predetermined temperature from the second temperature while the temperature control medium of the second temperature is being supplied to the flow path 15 from the temperature control device 20, the controller 71 controls the pressure BP of the heat transfer gas from the gas supply 18 after the lapse of the predetermined time $\Delta wt$ from the timing when the temperature of the temperature control medium has changed. The controller 71 increases the pressure BP of the heat transfer gas from the gas supply 18 when the temperature of the temperature control medium is increased by equal to or more than the predetermined temperature, whereas the controller 71 decreases the pressure BP of the heat transfer gas from the gas supply 18 when the temperature of the temperature control medium is reduced by equal to or more than the predetermined temperature.

By way of example, the controller 71 calculates the correction amount ΔP of the pressure BP of the heat transfer gas for correcting the temperature change of the substrate W by using the relational expression representing the relationship between the pressure BP of the heat transfer gas supplied from the gas supply 18 and the temperature Tw of the substrate W. Specifically, the controller 71 specifies, from the parameter data 72a, values of the parameters a and b corresponding to the amount of the heat input of the plasma processing being performed when the temperature change has occurred or corresponding to the processing condition of the plasma processing being performed. The controller 71 calculates the correction amount ΔP of the pressure BP of the heat transfer gas for correcting the temperature change of the substrate W by using the expression (7) to which the specified values of the parameters a and b are applied. Then, the controller 71 performs a control of changing the pressure BP of the heat transfer gas to be supplied from the gas supply 18 after the predetermined time Δwt passes by from the timing when the temperature change has occurred.

Figure 11:
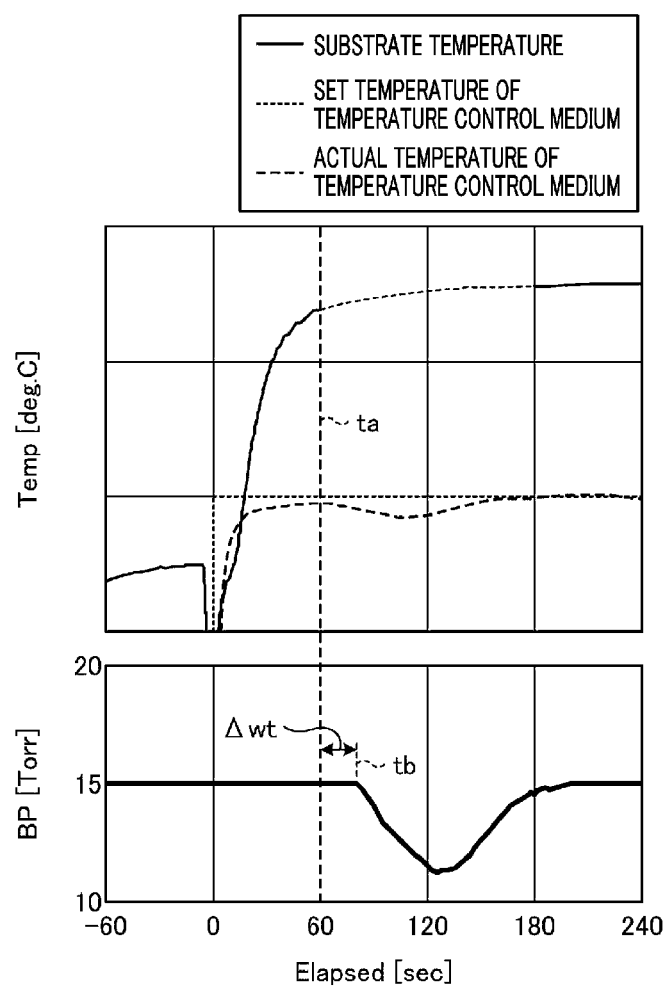
FIG. 11 is a diagram for describing control over the pressure of the heat transfer gas according to the exemplary embodiment.

FIG. 11 is a diagram for describing a control over the pressure BP of the heat transfer gas according to the exemplary embodiment. The waveforms of the variation of the actual temperature of the temperature control medium supplied to the flow path 15 of the placing table 11 and the variation of the set temperature of the temperature control medium, which are the same as those illustrated in FIG. 5, are shown in the upper part of FIG. 11. Further, a variation of the pressure BP of the heat transfer gas is shown in the lower part of FIG. 11. Moreover, a waveform of the variation of the temperature Tw of the substrate W after being corrected through the control over the pressure BP of the heat transfer gas is shown in the upper part of FIG. 11.

If the temperature of the temperature control medium has changed by equal to or more than the predetermined temperature after the temperature of the temperature control medium measured by the temperature sensor 21 comes into a normal state, the controller 71 controls the pressure BP of the heat transfer gas from the gas supply 18 so as to eliminate the temperature change of the substrate W caused by the temperature change of the temperature control medium. For example, when the temperature of the temperature control medium measured by the temperature sensor 21 falls within a certain range (for example, 3° C.) regarded as the normal state from the set temperature of the temperature control medium, the controller 71 makes a determination that the temperature of the temperature control medium has reached the normal state. In addition, the controller 71 may also make a determination that the temperature of the temperature control medium has reached the normal state when the temperature change of the temperature control medium falls within the certain range even for a certain time. When the temperature of the temperature control medium comes into the normal state, the controller 71 makes a determination upon whether the temperature of the temperature control medium measured by the temperature sensor 21 has changed by equal to or more than the predetermined temperature.

In FIG. 11, the temperature of the temperature control medium measured by the temperature sensor 21 is changed by equal to or more than the predetermined temperature at a timing ta. The controller 71 controls the pressure BP of the heat transfer gas from the gas supply 18 so as to eliminate the temperature change of the substrate W due to the temperature change of the temperature control medium, after the predetermined time Δwt has elapsed from the timing ta. In FIG. 11, the temperature control medium of the second temperature is supplied to the flow path 15. The controller 71 performs a control of reducing the pressure BP of the heat transfer gas from the gas supply 18 at a timing tb upon the lapse of the predetermined time Δwt from the timing ta. For example, the controller 71 specifies, from the parameter data 72a, values of the parameters a and b corresponding to a processing condition of the second plasma processing being performed when the temperature of the temperature control medium has changed by equal to or more than the predetermined temperature. The controller 71 calculates the correction amount ΔP of the pressure BP of the heat transfer gas by using the expression (7) to which the values of the specific parameters a and b are applied. The controller 71 performs a control of reducing the pressure BP of the heat transfer gas from the gas supply 18 by as much as the correction amount ΔP at the timing tb.

In the placing table 11, if the pressure of the heat transfer gas discharged from the discharge opening 11b decreases, the thermal conductivity between the electrostatic chuck ESC and the substrate W decreases, and the temperature of the substrate W rises. Accordingly, as the pressure BP of the heat transfer gas supplied from the gas supply 18 decreases, the temperature of the substrate W increases. Consequently, the temperature of the substrate W is corrected as shown by a dashed line of FIG. 11. In this way, the substrate processing apparatus 1 is capable of suppressing the temperature of the substrate W from being changed as a result of being affected by the temperature change of the temperature control medium even when the temperature of the temperature control medium flown to the flow path 15 of the placing table 11 is changed.

(Substrate Temperature Correction Method)

Figure 12:
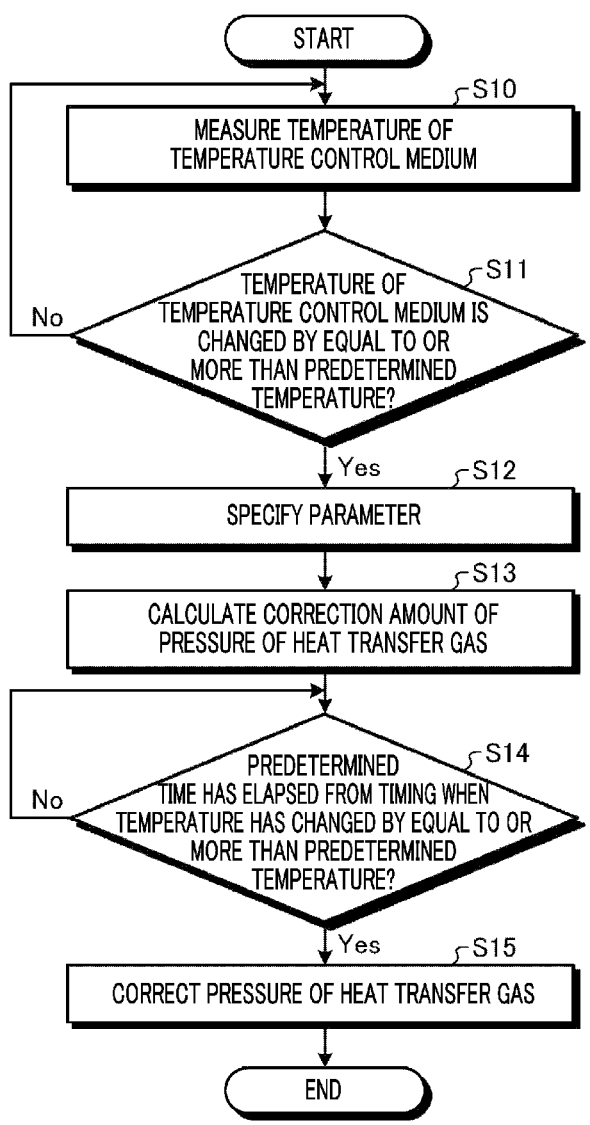
FIG. 12 is a flowchart illustrating an example of a substrate temperature correction method according to the exemplary embodiment.

FIG. 12 is a flowchart illustrating an example of the substrate temperature correction method according to the exemplary embodiment. The substrate temperature correction method shown in FIG. 12 is carried out as the controller 71 controls the individual components of the apparatus main body 10. The controller 71 starts a processing illustrated in FIG. 12 when the temperature of the temperature control medium comes into the normal state.

The controller 71 measures the temperature of the temperature control medium by the temperature sensor 21 (S10). The controller 71 determines whether the temperature of the temperature control medium measured by the temperature sensor 21 has changed by equal to more than the predetermined temperature (S11). If the temperature of the temperature control medium has not changed by equal to or more than the predetermined temperature (S11: No), the processing returns to the process S10 described above.

Meanwhile, if the temperature of the temperature control medium has changed by equal to or more than the predetermined temperature (S11: Yes), the controller 71 specifies, from the parameter data 72a, the values of the parameters a and b corresponding to the processing condition of the second plasma processing being performed (S12). The controller 71 calculates the correction amount ΔP of the pressure BP of the heat transfer gas for correcting the temperature change of the substrate W by using the expression (7) to which the specified values of the parameters a and b are applied (S13).

The controller 71 determines whether or not the predetermined time Δwt has elapsed from the timing ta when the temperature of the temperature control medium has changed by equal to or more than the predetermined temperature (S14). If the predetermined time Δwt has not passed by (S14: No), the processing returns to the process S14 described above.

Meanwhile, if the predetermined time Δwt has elapsed (S14: Yes), the controller 71 performs the control of changing the pressure BP of the heat transfer gas supplied from the gas supply 18 by as much as the correction amount ΔP (S15), and ends the processing. Upon the completion of the processing, the controller 71 may perform the substrate temperature correction method shown in FIG. 12 again.

As described above, the substrate processing apparatus 1 according to the exemplary embodiment includes the placing table 11, the gas supply 18, a measurement unit (the temperature sensor 21), and the controller 71. The placing table 11 has the placing surface 11a on which the substrate W is placed, and the flow path 15 through which the temperature control medium flows is formed inside the placing table 11. Further, the placing table 11 is provided with the discharge opening 11b through which the heat transfer gas is discharged to the placing surface 11a. The measurement unit is configured to measure the temperature of the temperature control medium flown into the flow path 15. If the temperature of the temperature control medium measured by the measurement unit has changed by equal to or more than the predetermined temperature, controller 71 controls the pressure BP of the heat transfer gas supplied from the gas supply 18 so as to eliminate the temperature change of the substrate W due to the temperature change of the temperature control medium after the predetermined time Δwt during which the temperature change of the substrate W placed on the placing surface 11a takes place due to the temperature change of the temperature control medium has passed by from the timing when the temperature of the temperature control medium has changed. Thus, the substrate processing apparatus 1 is capable of suppressing the temperature change of the substrate W caused by the temperature change of the temperature control medium.

In addition, if the temperature of the temperature control medium has increased by equal to or more than the predetermined temperature, the controller 71 performs the control of increasing the pressure BP of the heat transfer gas supplied from the gas supply 18, and if the temperature of the temperature control medium has decreased by equal to or more than the predetermined temperature, the controller 71 performs the control of reducing the pressure BP of the heat transfer gas supplied from the gas supply 18. Accordingly, by increasing the pressure BP of the heat transfer gas, the thermal conductivity between the placing table 11 and the substrate W is increased, and by reducing the pressure BP of the heat transfer gas, the thermal conductivity between the placing table 11 and the substrate W is reduced. Thus, the temperature change of the substrate W due to the temperature change of the temperature control medium can be suppressed.

Moreover, the controller 71 calculates the correction amount ΔP of the pressure BP of the heating gas for correcting the temperature change of the substrate W by using the relational expression (for example, the expression (7)) indicating the relationship between the pressure BP of the heat transfer gas supplied from the gas supply 18 and the temperature of the substrate W, and performs the control of changing the pressure BP of the heat transfer medium supplied from the gas supply 18 by the correction amount ΔP after the predetermined time Δwt has elapsed from the timing when the temperature of the substrate W has changed. Thus, since the substrate processing apparatus 1 is capable of correcting the pressure BP of the heat transfer gas by as much as the correction amount of the temperature change of the substrate W, the substrate processing apparatus 1 is capable of reducing the temperature change of the substrate W due to the temperature change of the temperature control medium.

Further, the relational expression includes the parameters a and b. The storage 72 stores therein the parameter data 72a in which the values of the parameters a and b of the relational expressions are matched with the heat input amounts of the plasma processing or the processing conditions of the plasma processing. The controller 71 specifies the values of the parameters a and b corresponding to the heat input amount of the plasma processing being performed or the processing condition of the plasma processing being performed when the temperature of the temperature control medium measured by the measurement unit has changed by equal to or more than the predetermined temperature. Then, the controller 71 calculates the correction amount ΔP of the pressure BP of the heat transfer gas for correcting the temperature change of the substrate W by using the relational expression to which the specified values of the parameters a and b are applied. Thus, since the substrate processing apparatus 1 is capable of calculating the correction amount ΔP according to the plasma processing being performed, the temperature change of the substrate W due to the temperature change of the temperature control medium can be further reduced.

Moreover, a temperature control medium supply unit (the temperature control device 20) circulates the temperature control medium through the flow path 15, and supplies the temperature control medium of the first temperature or the temperature control medium of the second temperature into the flow path 15 while switching them. If the temperature of the temperature control medium measured by the measurement unit changes by equal to or more than the predetermined temperature from the first temperature while the temperature control medium of the first temperature is supplied from the temperature control medium supply unit into the flow path 15, and if the temperature of the temperature control medium measured by the measurement unit changes by equal to or more than the predetermined temperature from the second temperature while the temperature control medium of the second temperature is supplied from the temperature control medium supply unit into the flow path 15, the controller 71 controls the pressure BP of the heat transfer gas supplied from the gas supply 18 after the lapse of the predetermined time Δwt from the timing when the temperature change of the temperature control medium has occurred. Thus, the substrate processing apparatus 1 is capable of reducing the temperature change of the substrate W due to the influence of the temperature change of the temperature control medium.

In addition, the predetermined time Δwt is determined by measuring a period taken before the temperature change of the substrate W occurs after the temperature of the temperature control medium has changed. Accordingly, since the pressure BP of the heat transfer gas can be corrected at a timing when the temperature change of the substrate W actually takes place after the temperature of the temperature control medium has changed, the temperature change of the substrate W due to the influence of the temperature change of the temperature control medium can be reduced.

Furthermore, the predetermined time $\Delta$wt is calculated through an operation using the delay time t1 dependent on the pipeline volume, the time t2 taken for the heat transfer from the temperature control medium to the substrate, and the time t3 taken before the pressure BP is actually changed after the instruction to change the pressure of the heat transfer gas is made. Thus, the predetermined time $\Delta$wt can be logically calculated without needing to measure it.

The exemplary embodiments disclosed herein are illustrative in all aspects and do not limit the present disclosure. In fact, the above exemplary embodiments can be embodied in various forms. Further, the above-described exemplary embodiments may be omitted, replaced, or modified in various forms without departing from the scope and spirit of the appended claims.

For example, the above exemplary embodiment has been described for the example where the substrate W is the semiconductor wafer. However, the present disclosure is not limited thereto, and the substrate W may be any of various types.

Furthermore, the above exemplary embodiment has been described for the example where the temperature control device 20 controls the temperature of the substrate W by supplying the temperature control medium of the first temperature T1 and the temperature control medium of the second temperature T2 to the flow path 15 of the placing table 11 while switching them. However, the present disclosure is not limited thereto. The temperature control device 20 may adopt a configuration as described in Patent Document 2, for example, and be configured to adjust the temperature of the substrate W by mixing the temperature control medium of the first temperature T1 and the temperature control medium of the second temperature T2 to the set temperature and supplying the mixture of the set temperature into the flow path 15. In this configuration as well, it is possible to suppress the temperature change of the substrate W caused by the influence of the temperature change of the temperature control medium.

Figure 13:
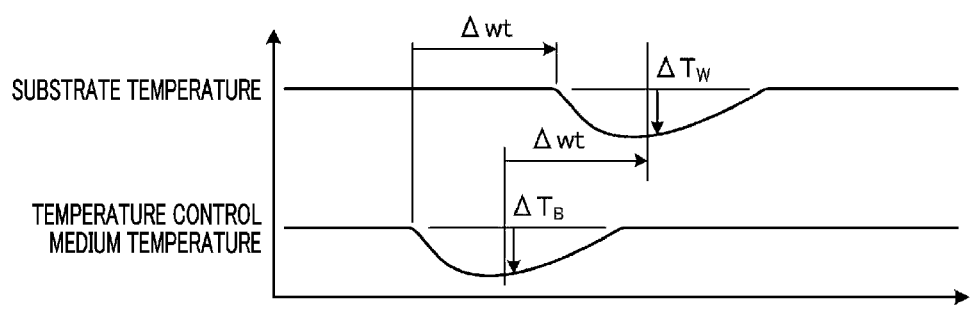
FIG. 13 is a diagram for describing another example of the correction of the temperature of the substrate according to the exemplary embodiment.

Further, the above exemplary embodiment has been described for the example where the temperature of the temperature control medium is changed by being affected by the temperature control medium remaining in the flow path when the temperature of the temperature control medium is switched between the first temperature T1 and the second temperature T2. However, the present disclosure is not limited thereto. The substrate temperature correction method of the present disclosure can be applied to suppress the temperature change of the substrate W caused by the influence of the temperature change of the temperature control medium when the temperature change of the temperature control medium takes place for any reason. FIG. 13 is a diagram illustrating another example of the correction of the temperature of the substrate W according to the exemplary embodiment. In FIG. 13, a temperature change $\Delta T_B$ of the temperature control medium takes place while the temperature control medium of a constant temperature is supplied to the flow path 15 of the placing table 11, and a temperature change $\Delta T_W$ of the substrate W takes place due to the influence of this temperature change $\Delta T_B$ of the temperature control medium. In this case as well, by controlling the pressure BP of the heat transfer gas so as to eliminate the temperature change $\Delta TW$ of the substrate W after the lapse of the predetermined time $\Delta$wt from the timing when the temperature change $\Delta T_B$ has occurred, it is possible to suppress the temperature change $\Delta T_W$ of the substrate caused by the temperature change $\Delta T_B$ Of the temperature control medium.

Furthermore, in the above-described exemplary embodiment, the parameter data 72a in which the values of the parameters a and b of the relational expression are stored is stored for each heat input amount of the plasma processing or each processing condition of the plasma processing. However, the present disclosure is not limited thereto. A relational expression (for example, the expression (7)), to which the values of the parameters a and b corresponding to the processing condition for each heat input amount of the plasma processing or each processing condition of the plasma processing are applied, may be stored in the storage 72. The controller 71 may specify, from the storage 72, the relational expression corresponding to the heat input amount of the plasma processing or the processing condition of the plasma processing, and may calculate the correction amount $\Delta$P of the pressure BP of the heat transfer gas to correct the temperature change of the substrate W by using the specified relational expression. Further, when there is only one relational expression corresponding to the plasma processing, the controller 71 may incorporate the relational expression into the program and calculate the correction amount $\Delta$P of the pressure BP of the heat transfer gas for correcting the temperature change of the substrate W by using the incorporated relational expression.

In addition, the above exemplary embodiment has been explained for the example where the correction amount $\Delta$P required to return the temperature Tw of the substrate W is calculated when the temperature of the temperature control medium has changed by equal to or more than the predetermined temperature. However, the present disclosure is not limited thereto. Even if the temperature change of the temperature control medium is rapid, the change in the temperature Tw of the substrate W is small when the period for the temperature change is short. On the other hand, even if the temperature change of the temperature control medium is gentle, the change in the temperature Tw of the substrate W is large when the period for the temperature change is long. In this way, the change in the temperature Tw of the substrate W differs depending on the shape of the waveform of the temperature change of the temperature control medium. Therefore, the controller 71 may control the pressure BP of the heat transfer gas supplied from the gas supply 18 according to the shape of the waveform of the temperature change of the temperature control medium when the temperature of the temperature control medium has changed by equal to or more than the predetermined temperature. For example, the controller 71 may calculate the correction amount of the pressure BP of the heat transfer gas from the shape of the waveform of the temperature change of the temperature control medium. By way of example, to reduce the temperature change of the substrate W, for each type of the shape of the waveform of the temperature change of the temperature control medium, a correction coefficient capable of correcting the correction amount $\Delta$P may be obtained by an experiment or the like to be stored as correction coefficient data. When the temperature change $\Delta T_B$ of the temperature control medium occurs, the controller 71 specifies the type of the shape of the waveform of the temperature change $\Delta T_B$, and specifies the correction coefficient corresponding to the specified type from the correction coefficient data. The controller 71 may perform a control of correcting the correction amount by multiplying the correction amount $\Delta$P by the specified correction coefficient, and changing the pressure BP of the heat transfer gas supplied from the gas supply 18 by the corrected correction amount. Therefore, since the correction amount corresponding to the waveform of the temperature change of the temperature control medium can be calculated, the temperature change of the substrate can be further suppressed.

Moreover, in the above-described exemplary embodiment, the thermal conductivity between the placing table 11 and the substrate W is adjusted by adjusting the pressure of the heat transfer gas supplied into the gap between the placing table 11 and the substrate W. However, the present disclosure is not limited thereto. The temperature control medium flows in the flow path 15 formed inside the placing table 11, and the thermal conductivity between the temperature control medium and the placing table 11 can be adjusted by adjusting a flow velocity of the temperature control medium. For example, by increasing the flow velocity of the temperature control medium, the thermal conductivity between the temperature control medium and the placing table 11 increases. On the other hand, by reducing the flow velocity of the temperature control medium, the thermal conductivity between the temperature control medium and the placing table 11 is reduced. Thus, when the temperature of the temperature control medium measured by the measurement unit has changed by equal to or more than the predetermined temperature, the controller 71 may control the thermal conductivity in the range from the temperature control medium to the substrate W positioned on the placing surface 11*a* to eliminate the temperature change of the substrate W due to the temperature change of the temperature control medium after the predetermined time Δwt elapses from the timing when the temperature of the temperature control medium is changed. The controller 71 increases the thermal conductivity in the range from the temperature control medium to the substrate W disposed on the placing surface 11*a* when the temperature of the temperature control medium has increased by equal to or more than the predetermined temperature, and reduces the thermal conductivity in the range from the temperature control medium to the substrate W positioned on the placing surface 11*a* when the temperature of the temperature control medium has decreased by equal to or more than the predetermined temperature. For example, the controller 71 increases the flow velocity of the temperature control medium flowing through the flow path 15 when the temperature of the temperature control medium has increased by equal to or more than the predetermined temperature, and reduces the flow velocity of the temperature control medium flowing through the flow path 15 when the temperature of the temperature control medium has decreased by equal to or more than the predetermined temperature. As an example of controlling the flow velocity of the temperature control medium, when a valve is provided either between the pipeline 16*a* and the flow path 15 or between the flow path 15 and the pipeline 16*b* at least, the flow velocity of the temperature control medium may be controlled by adjusting an opening degree of the installed valve. Alternatively, a function to vary a cross sectional area of the flow path 15 may be provided to control the flow velocity of the temperature control medium. Still alternatively, the flow velocity of the temperature control medium discharged from the temperature control device 20 to the pipeline 16 may be adjusted. By adopting any of these mechanisms, the thermal conductivity in the range from the temperature control medium and the substrate W placed on the placing surface 11*a* can be adjusted. In addition, the thermal conductivity between the temperature control medium and the placing table 11 is a part of the thermal conductivity in the range from the temperature control medium to the substrate W placed on the placing surface 11*a*. Additionally, by adopting these mechanisms in combination with the adjustment of the pressure of the heat transfer gas supplied into the gap between the placing table 11 and the substrate W, the thermal conductivity in the range from the temperature control medium to the substrate W placed on the placing surface 11*a* may be adjusted.

The above exemplary embodiment has been described for the case where capacitively coupled plasma (CCP) is used as an example of a plasma source. However, the present disclosure is not limited thereto. By way of non-limiting example, inductively coupled plasma (ICP), microwave-excited surface wave plasma (SWP), electron cyclotron resonance plasma (ECP) or helicon wave excited plasma (HWP) may be used as the plasma source.

In addition, although the above exemplary embodiment has been described for the case where the plasma processing such as plasma etching is performed on the substrate W as the substrate processing, the present disclosure is not limited thereto. The substrate processing may be any processing involving the heat input to the substrate W. For example, the substrate processing may be heat treatment such as ashing.

Further, in the above-described embodiment, the substrate processing apparatus 1 is a plasma processing apparatus configured to perform the plasma processing such as plasma etching. However, the present disclosure is not limited thereto. The substrate processing apparatus 1 may be any apparatus as long as it performs the substrate processing involving the heat input to the substrate W. For example, the substrate processing apparatus 1 may be a film forming apparatus, a modifying apparatus, or the like.

The exemplary embodiments disclosed herein are illustrative in all aspects and do not limit the present disclosure. In fact, the above exemplary embodiments can be embodied in various forms. Further, the above-described exemplary embodiments may be omitted, replaced, or modified in various forms without departing from the scope and spirit of the appended claims.

According to the exemplary embodiment, it is possible to suppress the temperature variation of the substrate which is caused by the temperature variation of the temperature control medium.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
    a placing table provided with a placing surface on which a substrate is placed, a flow path formed inside to allow a temperature control medium to flow therein, and a discharge opening through which a heat transfer gas is discharged to the placing surface;
    a gas supply configured to supply the heat transfer gas to be discharged through the discharge opening;
    a measurement unit configured to measure a temperature of the temperature control medium flown into the flow path; and
    a controller configured to control, when the temperature of the temperature control medium measured by the measurement unit is changed by equal to or more than a predetermined temperature at a change timing, a pressure of the heat transfer gas supplied from the gas supply to eliminate a temperature change of the substrate caused by a temperature change of the temperature control medium after a predetermined time taken before the temperature change of the substrate placed on the placing surface takes place due to the temperature change of the temperature control medium passes by from the change timing, wherein the controller is further configured to calculate a correction amount of the pressure of the heat transfer gas for correcting the temperature change of the substrate by using a relational expression indicating a relationship between the pressure of the heat transfer gas supplied from the gas supply and a temperature of the substrate, and to change the pressure of the heat transfer gas supplied from the gas supply by as much as the correction amount after the predetermined time elapses from the change timing.

2. The substrate processing apparatus of claim 1, wherein the controller increases the pressure of the heat transfer gas supplied from the gas supply when the temperature of the temperature control medium is increased by equal to or more than the predetermined temperature, whereas the controller decreases the pressure of the heat transfer gas supplied from the gas supply when the temperature of the temperature control medium is decreased by equal to or more than the predetermined temperature.

3. The substrate processing apparatus of claim 1, wherein the relational expression includes a parameter, and the substrate processing apparatus further comprises:

a storage configured to store therein parameter data in which a value of the parameter of the relational expression is stored for a heat input amount of a plasma processing or a processing condition of the plasma processing, and the controller specifies, from the parameter data, the value of the parameter corresponding to the heat input amount of the plasma processing being performed or the processing condition of the plasma processing being performed when the temperature of the temperature control medium measured by the measurement unit is changed by equal to or more than the predetermined temperature, and calculates the correction amount of the pressure of the heat transfer gas for correcting the temperature change of the substrate by using the relational expression to which the specified value of the parameter is applied.

4. The substrate processing apparatus of claim 1, wherein the controller controls the pressure of the heat transfer gas supplied from the gas supply based on a shape of a waveform of the temperature change of the temperature control medium when the temperature of the temperature control medium measured by the measurement unit is changed by equal to or more than the predetermined temperature.

5. The substrate processing apparatus of claim 1, further comprising:

a temperature control medium supply unit configured to circulate the temperature control medium through the flow path, and configured to supply the temperature control medium of a first temperature or the temperature control medium of a second temperature higher than the first temperature into the flow path, wherein when the temperature of the temperature control medium measured by the measurement unit is changed by equal to or more than the predetermined temperature from the first temperature while the temperature control medium of the first temperature is supplied from the temperature control medium supply unit into the flow path, and when the temperature of the temperature control medium measured by the measurement unit is changed by equal to or more than the predetermined temperature from the second temperature while the temperature control medium of the second temperature is supplied from the temperature control medium supply unit into the flow path, the controller controls the pressure of the heat transfer gas supplied from the gas supply after the predetermined time elapses from the change timing.

6. The substrate processing apparatus of claim 1, further comprising:

a temperature control medium supply unit configured to circulate the temperature control medium through the flow path, and configured to mix the temperature control medium of a first temperature and the temperature control medium of a second temperature higher than the first temperature to a set temperature to supply the temperature control medium, which is mixed, into the flow path, wherein when the temperature of the temperature control medium measured by the measurement unit is changed by equal to or more than the predetermined temperature from the set temperature while the temperature control medium mixed to have the set temperature is supplied from the temperature control medium supply unit into the flow path, the controller controls the pressure of the heat transfer gas supplied from the gas supply after the predetermined time elapses from the change timing.

7. The substrate processing apparatus of claim 1, wherein the predetermined time is determined by measuring a time period taken before the temperature change of the substrate occurs after the temperature of the temperature control medium changes.

8. The substrate processing apparatus of claim 1, wherein the predetermined time is calculated through an operation using a delay time dependent on a pipeline volume, a time taken for a heat transfer from the temperature control medium to the substrate, and a time taken before the pressure of the heat transfer gas actually changes after an instruction to change the pressure of the heat transfer gas is made.

9. A substrate temperature correction method, comprising:

measuring a temperature of a temperature control medium flown into a flow path of a placing table which is provided with a placing surface on which a substrate is placed, the flow path formed inside to allow the temperature control medium to flow therein, and a discharge opening through which a heat transfer gas is discharged to the placing surface; and controlling, when the measured temperature of the temperature control medium is changed by equal to or more than a predetermined temperature at a change timing, a pressure of the heat transfer gas discharged through the discharge opening to eliminate a temperature change of the substrate caused by a temperature change of the temperature control medium after a predetermined time taken before the temperature change of the substrate placed on the placing surface takes place due to the temperature change of the temperature control medium passes by from the change timing, wherein, in the controlling the pressure of the heat transfer gas, a correction amount of the pressure of the heat transfer gas for correcting the temperature change of the substrate is calculated by using a relational expression indicating a relationship between the pressure of the heat transfer gas supplied from the gas supply and a temperature of the substrate, and the pressure of the heat transfer gas supplied from the gas supply is changed by as much as the correction amount after the predetermined time elapses from the change timing.

10. A substrate processing apparatus, comprising:

a placing table provided with a placing surface on which a substrate is placed, and a flow path formed inside to allow a temperature control medium to flow therein;

a measurement unit configured to measure a temperature of the temperature control medium flown into the flow path; and a controller configured to control, when the temperature of the temperature control medium measured by the measurement unit is changed by equal to or more than a predetermined temperature at a change timing, thermal conductivity in a range from the temperature control medium to the substrate placed on the placing surface to eliminate a temperature change of the substrate caused by a temperature change of the temperature control medium after a predetermined time taken before the temperature change of the substrate placed on the placing surface takes place due to the temperature change of the temperature control medium passes by from the change timing, wherein the placing table is provided with a discharge opening through which a heat transfer gas is discharged to the placing surface, the substrate processing apparatus further comprises a gas supply configured to supply the heat transfer gas to be discharged through the discharge opening, and the controller controls a pressure of the heat transfer gas supplied from the gas supply, wherein the controller is further configured to calculate a correction amount of the pressure of the heat transfer gas for correcting the temperature change of the substrate by using a relational expression indicating a relationship between the pressure of the heat transfer gas supplied from the gas supply and a temperature of the substrate, and to change the pressure of the heat transfer gas supplied from the gas supply by as much as the correction amount after the predetermined time elapses from the change timing.

11. The substrate processing apparatus of claim 10, wherein the controller increases the thermal conductivity in the range from the temperature control medium to the substrate placed on the placing surface when the temperature of the temperature control medium is increased by equal to or more than the predetermined temperature, whereas the controller decreases the thermal conductivity in the range from the temperature control medium to the substrate placed on the placing surface when the temperature of the temperature control medium is decreased by equal to or more than the predetermined temperature.

12. The substrate processing apparatus of claim 11, wherein the controller increases the pressure of the heat transfer gas supplied from the gas supply when the temperature of the temperature control medium is increased by equal to or more than the predetermined temperature, whereas the controller decreases the pressure of the heat transfer gas supplied from the gas supply when the temperature of the temperature control medium is decreased by equal to or more than the predetermined temperature.

13. The substrate processing apparatus of claim 10, wherein the controller controls a flow velocity of the temperature control medium flown into the flow path.

14. The substrate processing apparatus of claim 13, wherein the controller increases the flow velocity of the temperature control medium flown into the flow path when the temperature of the temperature control medium is increased by equal to or more than the predetermined temperature, whereas the controller decreases the flow velocity of the temperature control medium flown into the flow path when the temperature of the temperature control medium is decreased by equal to or more than the predetermined temperature.

15. The substrate processing apparatus of claim 10, wherein the controller adjusts thermal conductivity in a range from the flow path to the substrate placed on the placing surface based on a shape of a waveform of the temperature change of the temperature control medium when the temperature of the temperature control medium measured by the measurement unit is changed by equal to or more than the predetermined temperature.

* * * * *